United States Patent
Ritchie et al.

[11] Patent Number: 5,216,237
[45] Date of Patent: Jun. 1, 1993

[54] OPTICAL DETECTOR WITH INTEGRAL FILTER AND HAVING FABRY PEROT RESONATOR SYSTEM

[75] Inventors: Simon Ritchie, Ipswich; Paul C. Spurdens, Woodbridge; Mark D. Learmouth, Felixstowe, all of England

[73] Assignee: British Telecommunications, plc, England

[21] Appl. No.: 762,026
[22] PCT Filed: Feb. 5, 1990
[86] PCT No.: PCT/GB90/00174
   § 371 Date: Sep. 17, 1991
   § 102(e) Date: Sep. 17, 1991
[87] PCT Pub. No.: WO90/09038
   PCT Pub. Date: Aug. 9, 1990

[30] Foreign Application Priority Data
   Feb. 3, 1989 [GB] United Kingdom ............... 8902363
   Mar. 20, 1989 [GB] United Kingdom ............... 8906325

[51] Int. Cl.[5] ............................................. H01J 40/14
[52] U.S. Cl. ............................. 250/214.1; 359/580; 257/431
[58] Field of Search ............... 250/211 J, 226, 211 R; 357/29, 30 E, 30 L, 30 B, 30 M; 359/123, 124, 580

[56] References Cited
U.S. PATENT DOCUMENTS
3,996,461 12/1976 Sulzbach et al. ............... 250/211 J
4,158,133 6/1979 Spaeth et al. ................... 250/211 J Primary Examiner—David C. Nelms
Assistant Examiner—Stephone Allen
Attorney, Agent, or Firm—Nixon & Vanderhye

[57] ABSTRACT

An optical detector such as a pin photodiode or avalanche photodiode is provided with an integral dielectric filter (8). The optical filter (8) preferably comprises a plurality of layers of silicon and silicon monoxide. If the detector is a PIN diode, the filter (8) may be provided on the underside of a substrate (1) before growth of the diode is commenced on the other side.

16 Claims, 4 Drawing Sheets

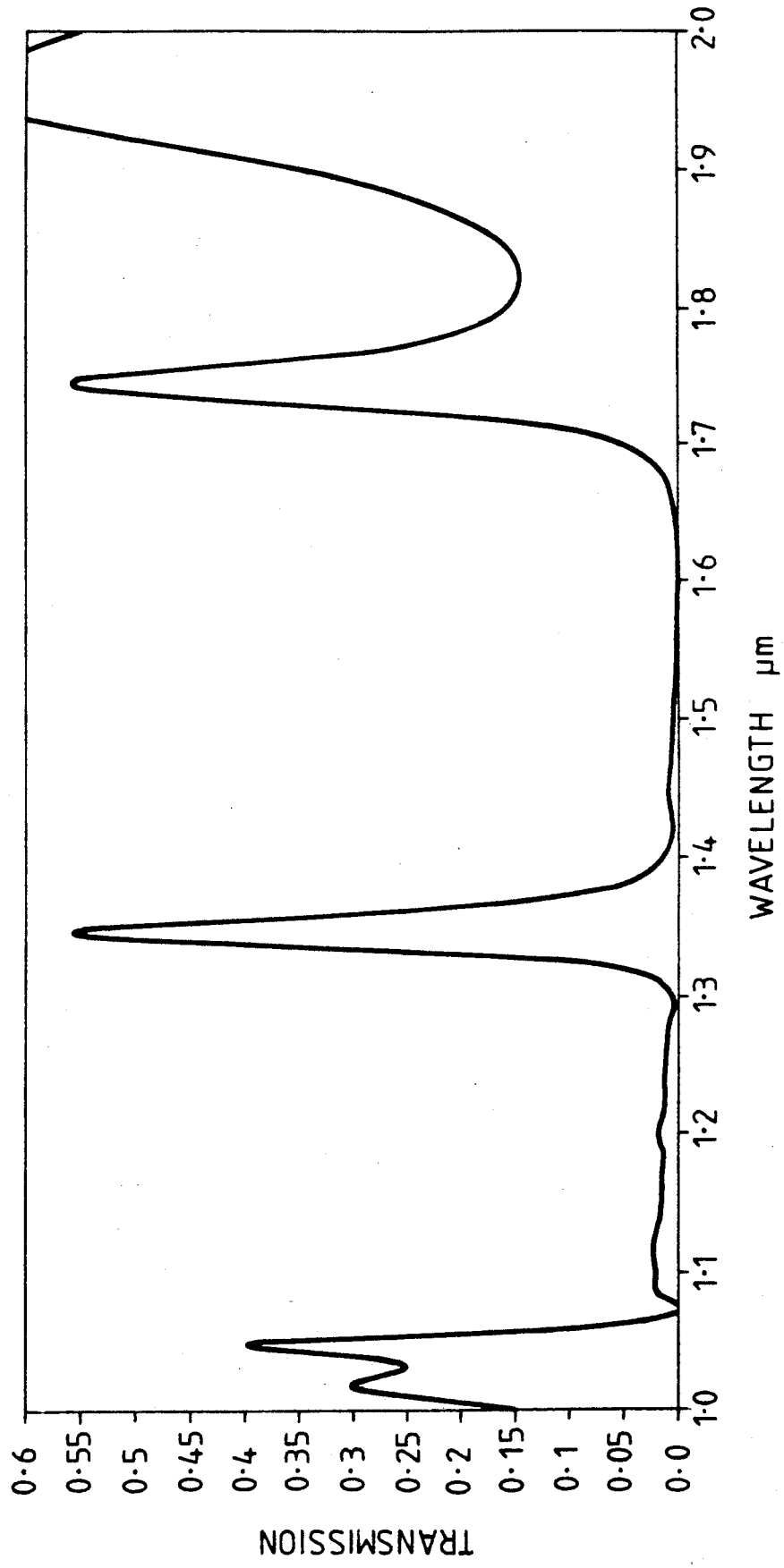

PROCESSING STEPS FOR FILTER DEPOSITION

SPIN BASE LAYER ON SAMPLE

DEPOSIT DIELECTRIC OVER BASE LAYER

SPIN RESIST ON DIELECTRIC

PATTERN RESIST

ETCH DIELECTRIC

OXYGEN PLASMA ASH TO REMOVE BASE LAYER AND UNDERCUT DIELECTRIC LAYER

DEPOSIT DIELECTRIC FILTER

DISSOLVE AWAY BASE LAYER IN SOLVENT LEAVING DIELECTRIC FILTER

OPTICAL DETECTOR WITH INTEGRAL FILTER AND HAVING FABRY PEROT RESONATOR SYSTEM

BACKGROUND

I. Field of the Invention

This invention relates to optical detectors, in particular to optical detectors incorporating optical filters, and more particularly to such detector and filter combinations suitable for use in optical communications.

II. Prior Art and Other Considerations

Optical communications systems employing optical fibres as the transmission medium are increasingly widely used. Such systems are now routinely being incorporated in national and international telecommunications networks.

There is an increasing desire to employ wavelength division multiplexing (WDM) techniques to increase the useful capacity of optical fibre links. WDM transmitters routinely comprise a plurality of narrow-linewidth semiconductor lasers, the operating wavelengths of the different lasers being suitable spaced apart. WDM demultiplexers or receivers employ either gratings or dielectric transmission filters to separate the various optical wavelengths. A disadvantage of such demultiplexers is that precise alignment of their many components is required, and this, together with the high cost of components such as gratings, makes such demultiplexers unsuitable for mass production, thereby inhibiting the widespread adoption of WDM systems.

The present invention seeks to facilitate the mass production of WDM demultiplexers and receivers.

SUMMARY

According to a first aspect of the present invention, there is provided an optical detector having an integral wavelength selective filter, the filter comprising a plurality of dielectric layers.

The detector may be an avalanche photodiode.

A WDM optical communications system may comprise a plurality of detectors according to the first aspect of the present invention, the wavelength selective filter on two or more of said detectors having passbands whose centre wavelengths differ by 20 nm or more.

According to a second aspect of the present invention, there is provided a demultiplexer for WDM optical communications system, comprising at least two optical detectors each having an integral wavelength selective filter, the wavelength selective filters each comprising a plurality of dielectric layers, and each of said wavelength selective filters having a different pass band.

According to a third aspect o the present invention, there is provided a WDM optical communications system comprising at least one optical fibre, a transmitter for launching WDM optical signals into said fibre, and a receiver arranged to receive said optical signals, wherein the receiver comprises at least two optical detectors each having an integral wavelength selective filter, the wavelength selective filters each comprising a plurality of dielectric layers, and each of said wavelength selective filters having a different pass band.

According to a fourth aspect of the present invention, there is provided a method of making a tuned optical detector, the method comprising the steps of:

forming an optical filter on a surface of a body of semiconductor, the filter comprising a plurality of layers of dielectric material, the refractive indices of the various layers being chosen to provide a desired filter characteristic; and forming a photodetector on a semiconductor substrate; the photodetector and the filter being so arranged that, in use, light passed by the filter is detected by said photodetector.

Preferably, the semiconductor substrate comprises a III-V semiconductor.

According to a fifth aspect of the present invention, there is provided a method of making a detector according to the first aspect of the present invention, which method comprises the step of forming an optical filter on a body of a semiconductor, the filter comprising a plurality of layers of dielectric material, and a lift-off step in which a thickness of 7 microns or more is removed.

The thickness removed may be between 7 and 10 microns inclusive.

In a method according to the fifth aspect of the present invention, a multi-layered structure of silicon and silicon monoxide having a thickness of 7 microns or more may be removed in a lift-off step.

In a preferred embodiment, the filter comprises dielectric layers. The filter may consist essentially of alternate semiconductor and dielectric layers may, for example, consist of silicon and silicon monoxide respectively.

Preferably, the photodetector is a PIN photodiode. Preferably, the PIN photodiode comprises InGaAs-/InP. Preferably, the photodiode is made using metal organic vapour phase epitaxy (MOVPE).

BRIEF DESCRIPTION OF THE DRAWINGS

Preferred embodiments of the present invention will now be described, by way of example only, with reference to the accompanying drawings, in which:

FIG. 3 shows the transmission characteristic of a dielectric filter of the type used in the detector shown;

DETAILED DESCRIPTION OF THE DRAWINGS

Figure 1:
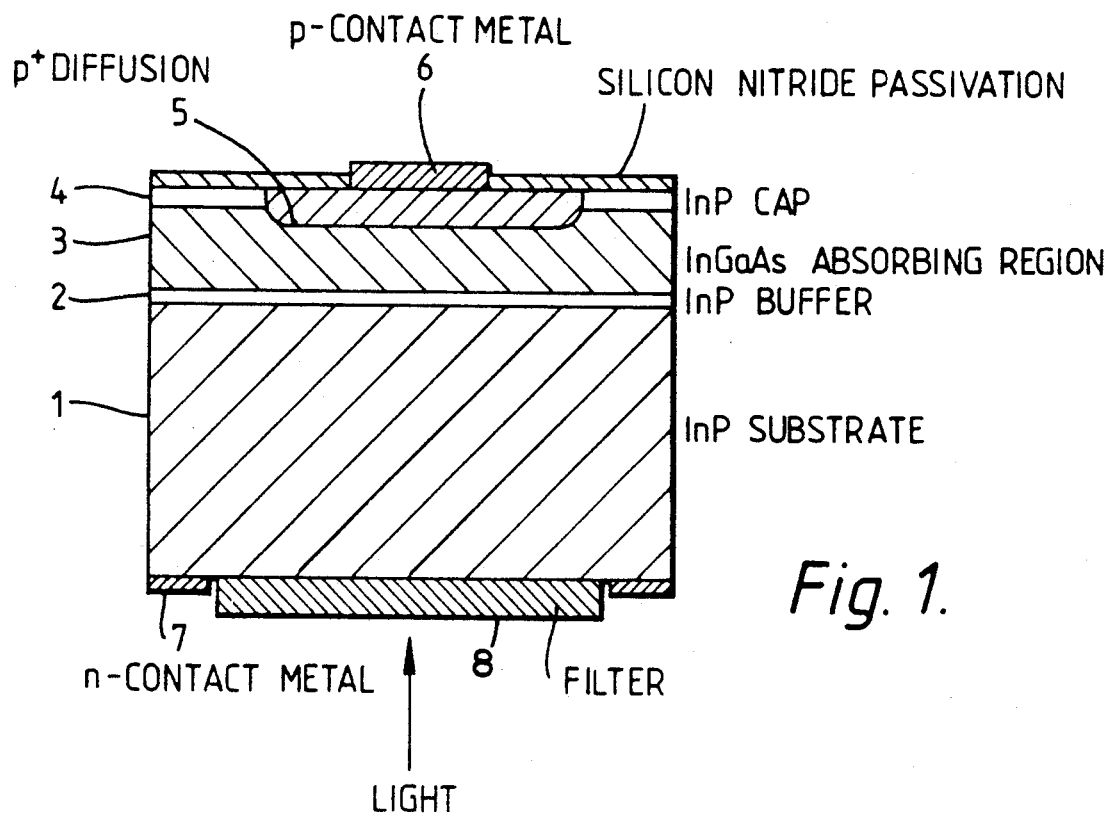
FIG. 1 shows schematically a substrate entry PIN diode with an integral dielectric filter according to the present invention.

A preferred embodiment of the invention is shown schematically in FIG. 1. The detector is a substrate entry PIN diode, analogous to that described in the paper by M. J. Robertson et al, Electron. Lett., 1988, Vol. 24, No. 5, pp252–254, the contents of which are incorporated herein by this reference. Such a detector comprises an InP substrate 1, an InP buffer layer 2, an InGaAs absorbing layer 3 with an InP capping layer 4. The localised pn junction 5 is made by diffusing a P dopant, for example zinc, through a silicon nitride mask. The sample is then diffused. Metallisation of both the p and n sides 6, 7 is with a Ti/Au bilayer. The active area of the device is low, 55 $\mu m^2$, in order to keep device capacitance low.

To that extent the device is conventional. However, as can be seen from the Figure, to the conventional pin diode there is added a filter 8. The filter is formed on the substrate so that light which reaches the absorbing region 3 passes first through the filter 8.

The filter 8 is a multilayer dielectric filter comprising multiple alternate layers of different dielectrics each of an optical thickness of λ/4 (that is with a thickness of λ/4n, where n is the refractive index of the layer and λ is the centre wavelength of the pass band), with a spacer layer(s) having an optical thickness of λ/2. The filter 8 may be configured as one or more, typically 3 or 4, Fabry Perot resonators. The filter may consist solely of dielectric materials, or may consist of dielectric and semiconductor materials—for example silicon monoxide and silicon.

A preferred filter construction utilises three λ/2 spacer layers of silicon monoxide each sandwiched between plural alternate λ/4 layers of silicon and silicon monoxide to provide what is effectively a three Fabry Perot resonator system.

Figure 2:
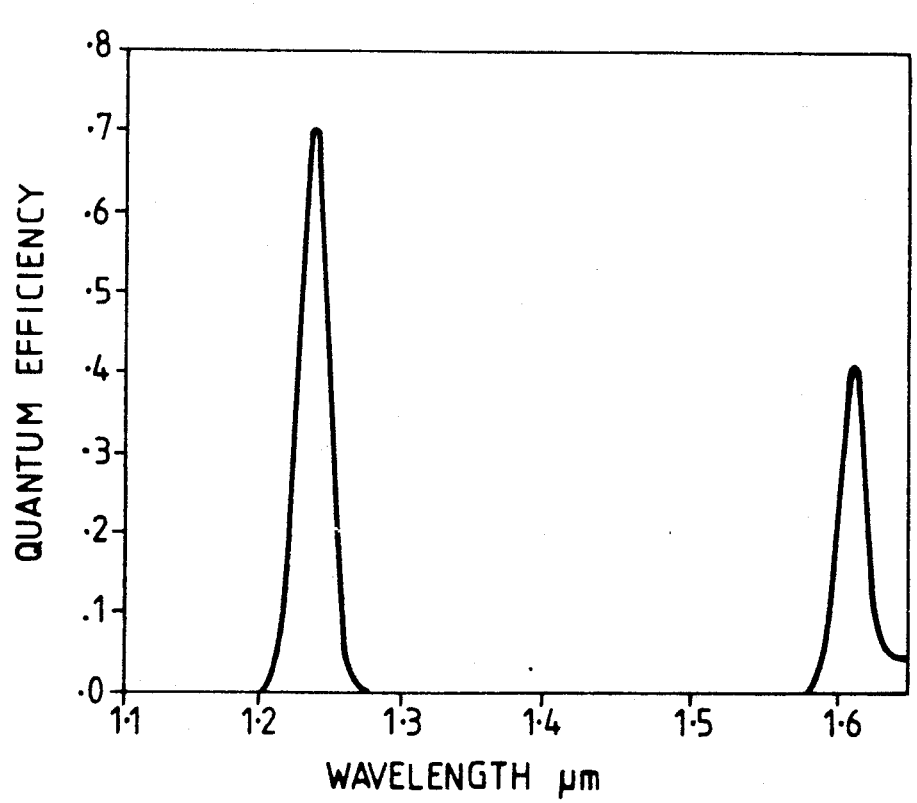
FIG. 2 is a graph illustrating the quantum efficiency against wavelength for a detector of the type shown in FIG. 1.
Figure 4A:
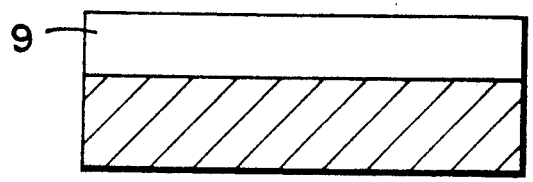
FIG. 4 shows schematically various stages in the production of a dielectric filter suitable for use in the present invention.
Figure 4B:
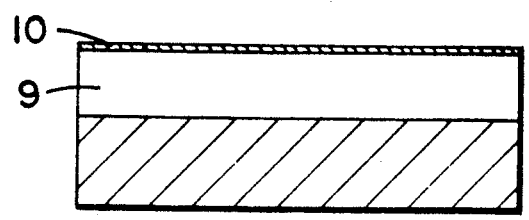
Figure 4C:
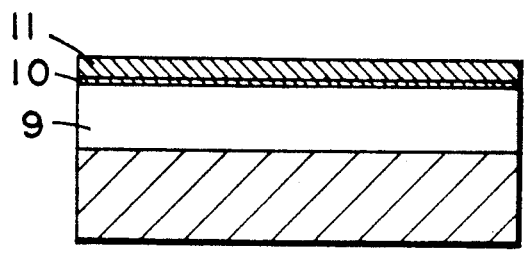
Figure 4D:
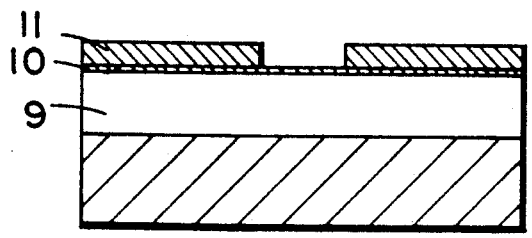
Figure 4E:
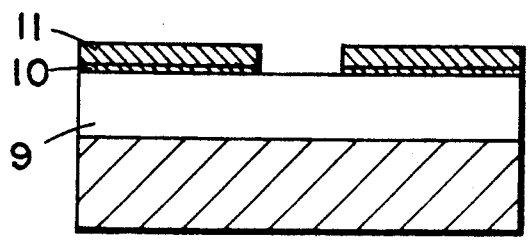
Figure 4F:
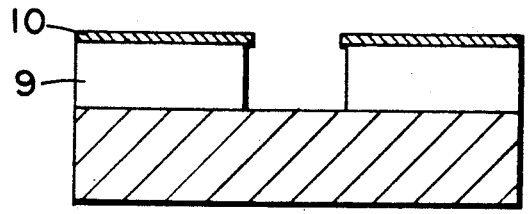
Figure 4G:
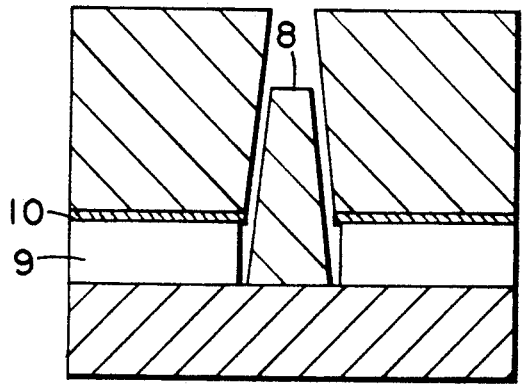
Figure 4H:
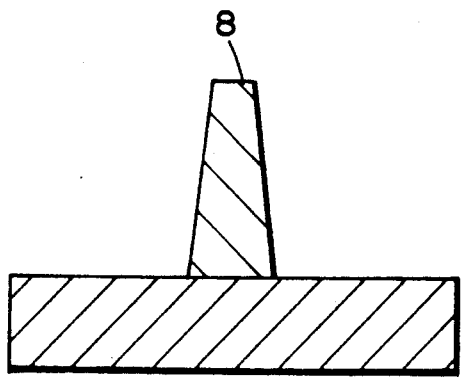

Useful performance, as illustrated in FIGS. 2 and 3, has been obtained from such a filter having an overall thickness of approximately 7 μm. The three Fabry Perot structure had 3 λ/2 silicon monoxide spacer layers, adjacent spacer layers being separated by ten λ/4 layers.

The number of layers and the number and configuration of the spacer layers are chosen to produce a band pass filter exhibiting a high transmission, narrow linewidth and high peak rejection. With a three Fabry Perot structure we have achieved FWHM linewidths of less than 20 nm at 1300 nm. Four Fabry Perot structures do not provide much narrower linewidth but sharpen the filter profile, reducing the 'tails'. Of course it is necessary to compromise between reducing the passband's tails—achieved by increasing the number of layers in the filter, and reducing the attenuation caused by the filter—achieved by reducing the overall thickness of the filter.

(A suitable unit cell for a triple Fabry Perot cell comprises the following sequence of lambda/4 layers of silicon (H) and silicon monoxide (L) starting from the substrate side of the filter: HLHLLLLLLHLHL. The sequence LLLLLL of course being the spacer layer. When the filter is grown on the substrate (InP), a silicon layer is grown first, starting the above sequence. Of course the same sequence can be used for four cavity systems and with other materials systems with three of four cavities, but it should not be considered to be optimised for such other systems. An alternative sequence suitable for silicon/silicon monoxide in a three or four cavity system is HLHLHLLHLHLH, the LL sequence providing the spacer layer. A further alternative sequence is HLHLLLLHLHL.)

Other influences affect both these properties. In particular we have found that the use of an electron beam evaporation technique in the deposition of the silicon layers and a thermal evaporation technique in the deposition of the silicon monoxide layers are both advantageous. The use of ion beam-assisted deposition is preferred in the deposition of silicon and silicon monoxide as this tends to increase deposit density. The PVD reactor conditions used during the deposition of silicon should be adjusted, as far as is practical, so as to minimise the stress in the silicon layers, because excess stress causes the band edge to spread, increasing absorption, particularly in the 1.3 um region.

The filter was deposited in an electron beam evaporator (a Balzers 640K machine) with continuous optical monitoring during deposition using a witness plate in the chamber. This allowed the layer deposition conditions to be adjusted during evaporation (using a well established automatic error compensation technique of the type described in "Thin film optical filters" by H. A. MacLeod, published by Adam Hilger, 1986) for optimum results. We have produced acceptable filters, with greater than 85 percent transmission and +5 nm centre wavelength tolerance, when the errors in the optical thickness (which is of course dependent on both thickness and refractive index) are controlled to +0.625.

After the deposition, the wafer was placed in a resist stripper which removed the stencil and the unwanted filter portions, leaving the patterned filter in place. The pin filter was then metallised on both sides and the metal patterned to produce the final integrated filter pin shown in FIG. 1. The process steps are further described below with reference to FIG. 4.

The filter stack and detector are formed either on opposite faces of the wafer or on the same face. The filter stack is formed using a lift-off technique, an aperture in a bilevel mask layer, with a suitable lip on the upper layer, also defining the site on which the filter stack is to be formed. The significant process steps are illustrated in sequence in FIG. 4.

First, the mask base layer 9, in this case polyimide, is spun on. Following any necessary curing or hardening of the base layer 9, a thin mask upper layer 10, in the case silicon nitride, is deposited on the base layer. Next, FIG. 4c, a resist 11, typically novolac photoresist, is spun onto the upper mask layer. The resist 11 is patterned, FIG. 4d, using a conventional etchant. The silicon nitride layer is then used as a mask as the polyimide is etched, FIG. 4f, using an oxygen plasma. The polyimide is over etched, with the result that the silicon nitride is undercut. The dielectric filter is formed from silicon and silicon monoxide, FIG. 4g, as described earlier. Finally, FIG. 4h, the polyimide base layer is dissolved, releasing the unwanted deposited layers, to leave the filter.

A generally suitable lift-off technique is also described in the paper by P Grabbe et al, in J. Vac. Sci. Tech., Vol. 21, Part I, 1982, pp 33-35, the contents of which are herein incorporated by this reference. Following the multiple deposition steps, the mask, which is typically silicon nitride over polyamide, is removed, along with the excess silicon and silicon monoxide. This technique makes possible the reproducible production of relatively cheap, wavelength selective, photodiodes for use as simple demultiplexers.

An advantageous way of fabricating substrate entry photodiodes according to the invention is to provide the filter structure on the semiconductor wafer before the wafer is processed to form the photodiode structure. The advantage of doing this is that it is possible to check the quality and performance of the filter structure before investing the time and expense necessary to produce the photodiodes. If there are faults in the filter structure it is possible either to reprocess the wafer after stripping of all or some of the filter, or to discard the wafer without losing the high value of a fully processed wafer. Such an approach depends on having a filter structure which will withstand or which can be made to withstand the processing stages involved in pin photodiode production; silicon/silicon monoxide can in general be used without the need for further protection.

The use of the combination of silicon monoxide and silicon is particularly advantageous in that the physical properties of both materials are very suitable: they adhere well to each other and to InP, they are strong, hard, not hygroscopic, and they are compatible with the processing steps used subsequently in device fabrication (whether or not the subsequent stages comprise the full or partial fabrication of the diode). Their optical properties are also quite good, and fit well with the wavelength range of principal current interest in the field of optical communications, 1.3–1.6 $\mu$m. Alternatives to silicon monoxide/silicon are silicon dioxide/silicon, silicon nitride/silicon, titanium dioxide/silicon dioxide.

The current-voltage characteristics of these substrate entry devices are similar to those from the same size pin detectors without a filter deposited, demonstrating that the filter deposition stage does not significantly affect the pin photodiode pin pn junction on the other side of the substrate. To confirm that the filter patterning stage did not significantly affect the filter characteristics, the transmission characteristics of a filter patterned as above on a blank InP substrate have been compared with an unpatterned test piece. There was no significant difference. FIG. 2 is a graph of quantum efficiency against wavelength for a typical substrate entry device, showing a full-width-half-maximum (FWHM) linewidth of 23 nm, a peak quantum efficiency of 73 percent at 1234 nm and a peak rejection of more than 32 dB, which is the limit of our detection system's resolution.

In order to assess the stability of the dielectric films, the transmission spectra of patterned filters on InP substrates were measured before and after being immersed in boiling water for 1 hour. There was no discernible change. Samples were also heated, in air, to 300° C. without a change in room temperature characteristics.

Photodetectors incorporating dielectric filters may also be utilised as noise filters in a laser amplifier photodetector configuration to eliminate noise from spontaneous emission and thereby increase the sensitivity obtainable from laser amplifier systems, particularly in 1.3 $\mu$m or 1.55 $\mu$m optical communications systems.

Devices using silicon/silicon monoxide filters have exhibited filter bandwidths of less than 20 nm with peak transmission approaching 100%. Such filters are usable in the wavelength range 1.3 to 1.6 $\mu$m.

Table 1 sets out some of the more important characteristics of a filter PIN according to the invention and a comparable conventional PIN.

We claim:

1. An optical detector for use in optical communications, the detector having an integral wavelength selective filter with a passband centered on a wavelength $\lambda$, wherein the detector comprises:
   (a) a substrate of semiconductor material;
   (b) a photodiode based on said substrate; and
   (c) a plurality of layers of material to provide said wavelength selective filter, at least some of which layers are dielectric material supported in relation to said substrate such that incoming optical radiation received, in use, by said photodiode passes first through said plurality of layers;
   wherein said plurality of layers provides a three or more Fabry Perot resonator system, having at least three spacer layers, each of which has a thickness of one or a multiple number of $\lambda/2n$ and is bounded on each side by a plurality of layers having a thickness of $\lambda/4n$, n being the refractive index of each respective layer at the wavelength $\lambda$.

2. An optical detector according to claim 1 wherein each spacer layer has a thickness of at least $3\lambda/2n$.

3. An optical detector according to claim 1, providing a three Fabry Perot resonator system, having no more than three spacer layers.

4. An optical detector according to claim 1 wherein a plurality of said layers comprise silicon.

5. An optical detector according to claim 1 wherein said layers of thickness $\lambda/4n$ comprise alternate silicon and silicon monoxide layers.

6. An optical detector according to claim 1 wherein $\lambda$ lies in the range 1.3 to 1.6 $\mu$m inclusive.

7. An optical detector according to claim 1 wherein the photodiode comprises a substrate entry device.

8. An optical detector according to claim 1 wherein the photodiode comprises an avalanche photodiode.

9. An optical detector according to claim 1 wherein the photodiode is a pin photodiode.

10. A wavelength division multiplexed optical communications system comprising at least two detectors according claim 1, the wavelength selective filters on two or more of said detectors having passbands whose respective center wavelength $\lambda$ differ by an amount of the order of 20 nm.

11. A wavelength division multiplexed optical communications system comprising at least two detectors according claim 1, the wavelength selective filters on two or more of said detectors having passbands whose respective center wavelength $\lambda$ differ by not more than 20 nm.

12. A method of making an optical detector for use in optical communications, the method comprising:
   forming a wavelength selective filter on a first side of a semiconductor body, the filter being formed by a plurality of layers of dielectric material, wherein the plurality of layers provides a three or more Fabry Perot resonator system, having at least three spacer layers, each of the spacer layers having a thickness of one or a multiple number of $\lambda/2n$ and being bounded on each side by a plurality of layers having a thickness of $\lambda/4n$, n being the refractive index of each respective layer at the wavelength $\lambda$.
   forming a photodiode on a second side of the semiconductor body.

13. A method as claimed in claim 12 wherein the method includes the step of forming a PIN photodiode on said body after the formation of said filter.

14. A method as claimed in claim 12 wherein the method comprises a lift-off step in which a thickness of 7 microns or more is removed.

15. A method as claimed in claim 12 wherein the thickness removed is between 7 and 10 microns inclusive.

16. A method as claimed in claim 12 wherein a multilayered structure of silicon and silicon monoxide having a thickness of 7 microns or more is removed in said lift-of step.

* * * * *